United States Patent
Trinh et al.

(10) Patent No.: US 11,723,212 B2
(45) Date of Patent: Aug. 8, 2023

(54) MEMORY WINDOW OF MFM MOSFET FOR SMALL CELL SIZE

(71) Applicant: Taiwan Semiconductor Manufacturing Co., Ltd., Hsinchu (TW)

(72) Inventors: Hai-Dang Trinh, Hsinchu (TW); Yi Yang Wei, Hsinchu (TW); Bi-Shen Lee, Hsinchu (TW); Fa-Shen Jiang, Taoyuan (TW); Hsun-Chung Kuang, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 17/346,627

(22) Filed: Jun. 14, 2021

(65) Prior Publication Data

US 2022/0310635 A1    Sep. 29, 2022

Related U.S. Application Data

(60) Provisional application No. 63/166,413, filed on Mar. 26, 2021.

(51) Int. Cl.
*H01L 21/00* (2006.01)
*H10B 53/30* (2023.01)
*H01L 49/02* (2006.01)

(52) U.S. Cl.
CPC ............. *H10B 53/30* (2023.02); *H01L 28/60* (2013.01)

(58) Field of Classification Search
CPC .......................... H01L 27/11507; H01L 28/60
See application file for complete search history.

(56) References Cited

U.S. PATENT DOCUMENTS

| | | |
|---|---|---|
| 2005/0167725 A1 | 8/2005 | Nagano et al. |
| 2007/0235787 A1 * | 10/2007 | Nagano ................... H01L 28/55 257/E27.084 |
| 2020/0357927 A1 | 11/2020 | Hsieh et al. |
| 2021/0035992 A1 | 2/2021 | Chen et al. |

* cited by examiner

*Primary Examiner* — Richard A Booth
(74) *Attorney, Agent, or Firm* — Eschweiler & Potashnik, LLC

(57) ABSTRACT

In some embodiments, the present disclosure relates to an integrated chip that includes one or more interconnect dielectric layers arranged over a substrate. A bottom electrode is disposed over a conductive structure and extends through the one or more interconnect dielectric layers. A top electrode is disposed over the bottom electrode. A ferroelectric layer is disposed between and contacts the bottom electrode and the top electrode. The ferroelectric layer includes a first lower horizontal portion, a first upper horizontal portion arranged above the first lower horizontal portion, and a first sidewall portion and coupling the first lower horizontal portion to the first upper horizontal portion.

20 Claims, 18 Drawing Sheets

MEMORY WINDOW OF MFM MOSFET FOR SMALL CELL SIZE

REFERENCE TO RELATED APPLICATION

This application claims the benefit of U.S. Provisional Application No. 63/166,413, filed on Mar. 26, 2021, the contents of which are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM) that uses a metal-ferroelectric-metal memory cell. Thus, FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
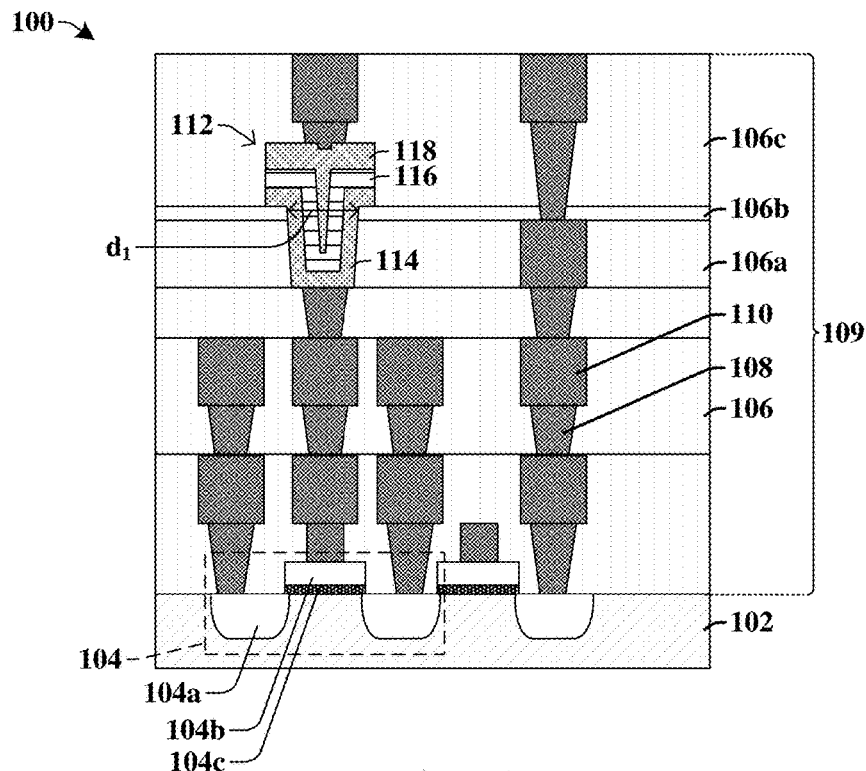
FIG. 1 illustrates a cross-sectional view of some embodiments of an integrated chip comprising a metal-ferroelectric-metal (MFM) structure arranged within an interconnect structure, wherein the MFM structure comprising a ferroelectric layer extending in vertical and horizontal directions between top and bottom electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-ferroelectric layer-metal (MFM) structure includes a ferroelectric layer arranged between top and bottom electrodes. An MFM structure may be coupled to and controlled by a transistor, such as a metal-oxide-semiconductor field-effect transistor (MOSFET). MFM-MOSFET devices are configured to store data values based on a process of reversible switching between polarization states because the ferroelectric layer's crystal structure is capable of changing when an electric field is present. For example, in an MFM cell, a negative voltage bias applied to the ferroelectric layer may induce atoms to shift into a first crystal structure orientation, which has a first resistance indicating a first data value (e.g., a logical '1'), whereas a positive voltage bias applied to the ferroelectric layer may induce atoms to shift into a second crystal structure orientation, which has a second resistance indicating a second data value (e.g., a logical '0').

The difference between the first resistance value indicating the first data value (e.g., a logical '1') and the second resistance value indicating the second data value (e.g., a logical '0') is known as the memory window of the MFM cell. When the memory window is increased, the reliability of the MFM cell is increased because it is easier to discern whether the MFM cell is storing the first data value (e.g., a logical '1') or the second data value (e.g., a logical '0'). In ferroelectric materials, an orthorhombic-phase of the crystal structure greatly influences the size of the memory window of the MFM cell because it is the orthorhombic-phase of the ferroelectric material that shifts between crystal structure orientations. Other phases of the crystal structure of a ferroelectric material may include, for example, tetragonal or monoclinic phases. As the orthorhombic-phase of the ferroelectric layer in an MFM cell increases, then the memory window increases.

The presence of the orthorhombic-phase increases when the ferroelectric layer has larger dimensions. However, in a planar-design MFM cell, wherein the bottom electrode, the ferroelectric layer, and the top electrode are planar layers, as critical dimensions of the MFM cell are reduced, the size of the ferroelectric layer is reduced and the presence of the orthorhombic-phase in the ferroelectric layer can be reduced and/or greatly vary between MFM cells, thereby reducing the memory window and reliability of the MFM cell(s).

Various embodiments of the present disclosure relate to a MFM-MOSFET comprising a ferroelectric layer that extends through multiple interconnect dielectric layers in the horizontal and vertical directions to increase the length and area of the ferroelectric layer. In some such embodiments, the total length of the ferroelectric layer is longer than the critical dimension of the MFM cell such that the presence of the orthorhombic-phase in the ferroelectric layer is increased to increase the memory window and reliability of the MFM-MOSFET.

FIG. 1 illustrates a cross-sectional view 100 of some embodiments of an integrated chip comprising a MFM structure coupled to an underlying semiconductor device.

The integrated chip of FIG. 1 includes an interconnect structure 109 arranged over a substrate 102. The interconnect structure 109 comprises interconnect wires 110 and interconnect vias 108 arranged in multiple interconnect dielectric layers 106. In some embodiments, the interconnect wires 110 and interconnect vias 108 of the interconnect structure 109 are coupled to an underlying semiconductor device 104 arranged on and/or within the substrate 102. In some embodiments, the underlying semiconductor device 104 may be or comprise a transistor. For example, in some embodiments, the underlying semiconductor device 104 is a metal-oxide-semiconductor field-effect transistor (MOSFET) that comprises source/drain regions 104a within the substrate 102; a gate electrode 104b arranged over the substrate 102 and between the source/drain regions 104a; and a gate dielectric layer 104c arranged between the gate electrode 140b and the substrate 102. In some embodiments, the underlying semiconductor device 104 comprises a planar MOSFET device, a finFET device, a gate all around FET, or some other suitable semiconductor device.

In some embodiments, a metal-ferroelectric-metal (MFM) structure 112 is arranged between two interconnect vias 108 in the interconnect structure 109. In some embodiments, the MFM structure 112 is arranged within and extends through a first interconnect dielectric layer 106a, a second interconnect dielectric layer 106b arranged over the first interconnect dielectric layer 106a, and a third interconnect dielectric layer 106c arranged over the second interconnect dielectric layer 106b. In some embodiments, the MFM structure 112 comprises a bottom electrode 114, a top electrode 118 arranged over the bottom electrode 114, and a ferroelectric layer 116 arranged between the top electrode 118 and the bottom electrode 114. The MFM structure 112 is coupled to and controlled by the underlying semiconductor device 104, in some embodiments, such that the integrated chip of FIG. 1 comprises a MFM-MOSFET device. In some embodiments, the MFM structure 112 is coupled to the gate electrode 104b of the underlying semiconductor device 104.

In some embodiments, the MFM structure 112 is formed by forming an opening in the first and second dielectric layers 106a, 106b and depositing each layer (114, 116, 118) of the MFM structure 112 within the opening and over the second dielectric layer 106b. The opening in the first and second dielectric layers 106a, 106b has a critical dimension equal to a first distance $d_1$. The critical dimension of the MFM structure 112 may be based on the device design and/or on processing limitations. In some embodiments, the first distance $d_1$ is in a range of between, for example, approximately 40 nanometers and approximately 250 nanometers.

In some embodiments, the layers (114, 116, 118) of the MFM structure 112 each comprise horizontally extending portions and vertically portions that extend through the first and second interconnect dielectric layers 106a, 106b. The layers (114, 116, 118) of the MFM structure 112 also horizontally extend over the second interconnect dielectric layer 106b and are surrounded by the third interconnect dielectric layer 106c. Further, in some embodiments, the ferroelectric layer 116 is arranged directly between the bottom and top electrodes 114, 118 in the vertical direction.

The ferroelectric layer 116 comprises a ferroelectric material such as, for example, strontium bismuth tantalite, lead zirconate titanate, hafnium zirconium oxide, doped hafnium oxide, or some other suitable material that has ferroelectric properties. Because of its ferroelectric properties, the ferroelectric layer 116 comprises a crystal structure configured to change between a first crystal structure orientation corresponding to a first resistance indicating a first data value (e.g., a logical '1') and a second crystal structure orientation corresponding to a second resistance indicating a second data value (e.g., a logical '0'). Therefore, depending on the voltage bias applied to the MFM structure 112 the resistance of the ferroelectric layer 116 changes and data (e.g., a logical '1' or a logical '0') is written to or read from the ferroelectric layer 116.

In some embodiments, the ferroelectric layer 116 comprises multiple phases such as, for example, the orthorhombic, tetragonal, or monoclinic phases. In some embodiments, the orthorhombic phase of the ferroelectric layer 116 that has the strongest ferroelectric properties. Because the ferroelectric layer 116 extends in the horizontal and vertical directions, the ferroelectric layer 116 has a length greater than the critical dimension (e.g., $d_1$) of the MFM structure 112 within the first and second dielectric layers 106a, 106b. Further, the length of the ferroelectric layer 116 is also greater than a maximum width of the MFM structure 112. Because the length of the ferroelectric layer 116 is increased, the instance of the orthorhombic phase in the ferroelectric layer 116 is increased, which increases the memory window and thus, reliability of the overall MFM-MOSFET device without sacrificing the area of the MFM structure 112 over the substrate 102.

Figure 2:
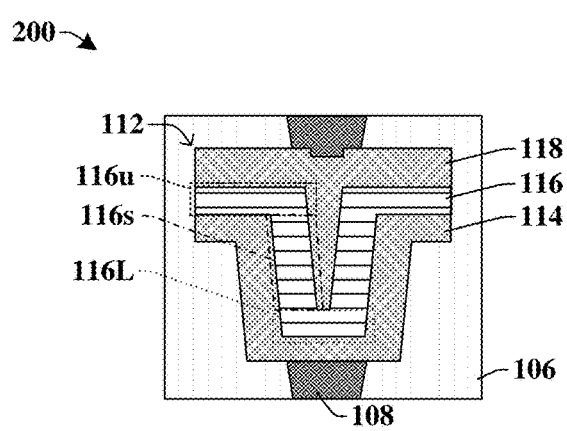
FIGS. 2-6 illustrate cross-sectional views of various embodiments of an MFM structure comprising a ferroelectric layer extending in vertical and horizontal directions and arranged between top and bottom electrodes.

FIG. 2 illustrates a magnified, cross-sectional view 200 of some embodiments of the MFM structure arranged within interconnect dielectric layers 106.

In some embodiments, the ferroelectric layer 116 may be described as comprising a first lower horizontal portion 116L, a first upper horizontal portion 116u arranged over the first lower horizontal portion 116L, and a first sidewall portion 116s arranged vertically between and coupling the first lower horizontal portion 116L to the first upper horizontal portion 116u of the ferroelectric layer 116. In some embodiments, the first lower horizontal portion 116L and the first upper horizontal portion 116u of the ferroelectric layer 116 extend in the horizontal direction, whereas the first sidewall portion 116s extends mainly in the vertical direction. In some embodiments, the first sidewall portion 116s may also extend partially in the horizontal direction such that the first sidewall portion 116s is substantially slanted between the first upper and lower horizontal segments 116u, 116L. Thus, in some embodiments, the first sidewall portion 116s meets the first lower horizontal portion 116L at an angle that is greater than 90 degrees.

Figure 3:
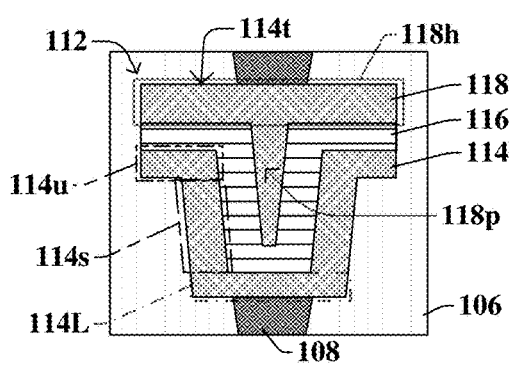

FIG. 3 illustrates a duplicate of FIG. 2 but with different features labeled for ease of illustration.

In some embodiments, the bottom electrode 114 comprises a second lower horizontal portion 114L, a second upper horizontal portion 114u arranged over the second lower horizontal portion 114L, and a second sidewall portion 114s arranged vertically between and coupling the second lower horizontal portion 114L to the second upper horizontal portion 114u of the bottom electrode 114. In some embodiments, the second lower horizontal portion 114L and the second upper horizontal portion 114u of the bottom electrode 114 extend in the horizontal direction, whereas the second sidewall portion 114s extends mainly in the vertical direction. In some embodiments, the second sidewall portion 114s may also extend partially in the horizontal direction such that the second sidewall portion 114s is substantially slanted between the second upper and lower horizontal segments 114u, 114L. Thus, in some embodiments, the second sidewall portion 114s meets the second lower horizontal portion 114L at an angle that is greater than 90 degrees.

In some embodiments, the top electrode 118 comprises a horizontal portion 118h is arranged directly on the first upper horizontal portion (116h of FIG. 2) of the ferroelectric layer 116 and the second upper horizontal portion 114u of the bottom electrode 114. In some embodiments, the top electrode 118 comprises a protrusion portion 118p extending downward from the horizontal portion 118h of the top electrode 118 to contact the first lower horizontal portion (116L of FIG. 2) and the first sidewall portion (116s of FIG. 2) of the ferroelectric layer 116. Further, in some embodiments, a topmost surface 114t of the top electrode 114 is substantially planar. In some other embodiments (e.g., FIG. 2), the topmost surface 114t of the top electrode 114 has an indentation arranged over the protrusion portion 114p of the top electrode 114. In some embodiments, outermost sidewalls of the ferroelectric layer 116 are arranged directly between outermost sidewalls of the bottom and top electrodes 114, 118 in the vertical direction.

In some embodiments, the first upper horizontal portion (116u of FIG. 2) of the ferroelectric layer 116, the second upper horizontal portion 114u of the bottom electrode 114, and the horizontal portion 118h of the top electrode 118 are all arranged above the first and second interconnect dielectric layers (106a, 106b of FIG. 1). In some embodiments, the first upper horizontal portion (116u of FIG. 2) of the ferroelectric layer 116 is arranged directly between the horizontal portion 118h of the top electrode 118 and the second upper horizontal portion 114u of the bottom electrode 114 in the vertical direction. In some embodiments, the first sidewall portion (116s of FIG. 2) of the ferroelectric layer 116 is arranged directly between the protrusion portion 118p of the top electrode 118 and the second sidewall portion 114s of the bottom electrode 114 in the horizontal direction. In some embodiments, the first lower horizontal portion (116L of FIG. 2) of the ferroelectric layer 116 is arranged directly between the second lower horizontal portion 114L of the bottom electrode 114 and the protrusion portion 118p of the top electrode 118 in the vertical direction.

Figure 4:
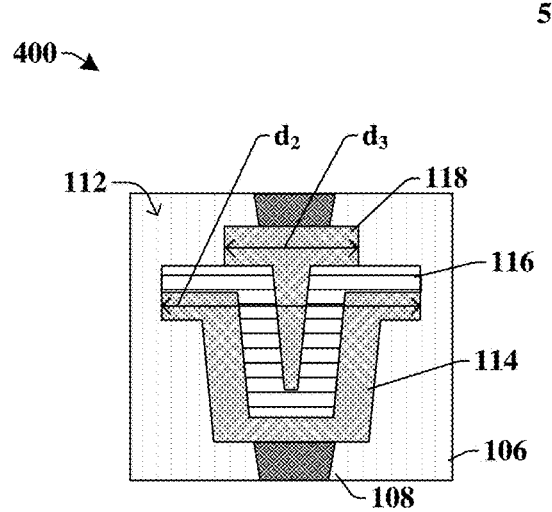

FIG. 4 illustrates a cross-sectional view 400 of some alternative embodiments of the MFM structure 112.

In some embodiments, an outer region of the ferroelectric layer 116 is uncovered by the top electrode 118. In some such embodiments, the bottom electrode 114 has a maximum width equal to a second distance $d_2$, and the top electrode 118 as a maximum width equal to a third distance $d_3$. In some embodiments, the second distance $d_2$ may be in a range of between, for example, approximately 60 nanometers and approximately 300 nanometers. In some such embodiments, the third distance $d_3$ is less than the second distance $d_2$. In some embodiments, the third distance $d_3$ is less than the second distance $d_2$ because the top electrode 118 may be patterned at a different time than the bottom electrode 114. Nevertheless, in some such embodiments, the length of the ferroelectric layer 116 arranged directly between the top electrode 118 and the bottom electrode 114 is greater than the critical dimension (e.g., $d_1$ of FIG. 1) of the MFM structure 112 to improve the memory window and reliability of the MFM structure 112.

Figure 5:
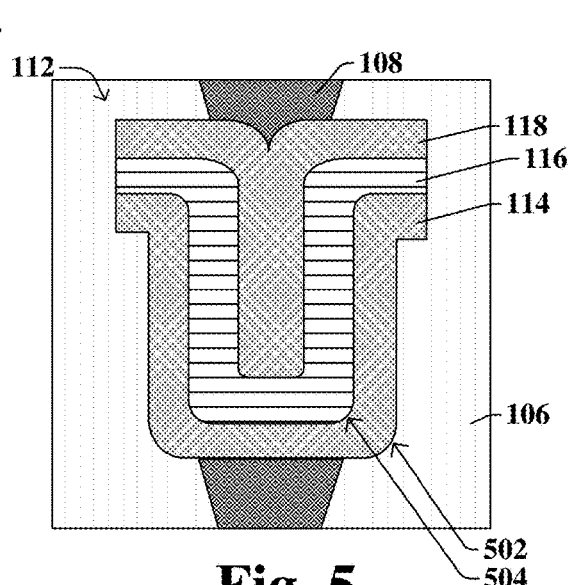

FIG. 5 illustrates a cross-sectional view 500 of yet some other embodiments of the MFM structure 112.

In some embodiments, outer sidewalls of the bottom electrode 114 may be substantially straight compared to the slanted outer sidewalls of the bottom electrode 114 in FIG. 5, for example. In some embodiments, an outer sidewall of the bottom electrode 114 meets a bottommost surface of the bottom electrode 114 at a first curved corner portion 502. Similarly, in some embodiments, an outer sidewall of the ferroelectric layer 116 meets a bottommost surface of the ferroelectric layer 116 at a second curved corner portion 504. In other words, in some embodiments, an outermost sidewall of the first sidewall portion (116s of FIG. 2) of the ferroelectric layer 116 is coupled to a bottommost surface of the first lower horizontal portion (116L of FIG. 2) of the ferroelectric layer 116 by the second curved corner portion 504, which is a rounded corner. It will be appreciated that the rounded corners (e.g., 502, 504) of the bottom electrode 114 and of the ferroelectric layer 116 in FIG. 5 may be present in any of the MFM structures 112 included in the drawings of this disclosure.

Figure 6:
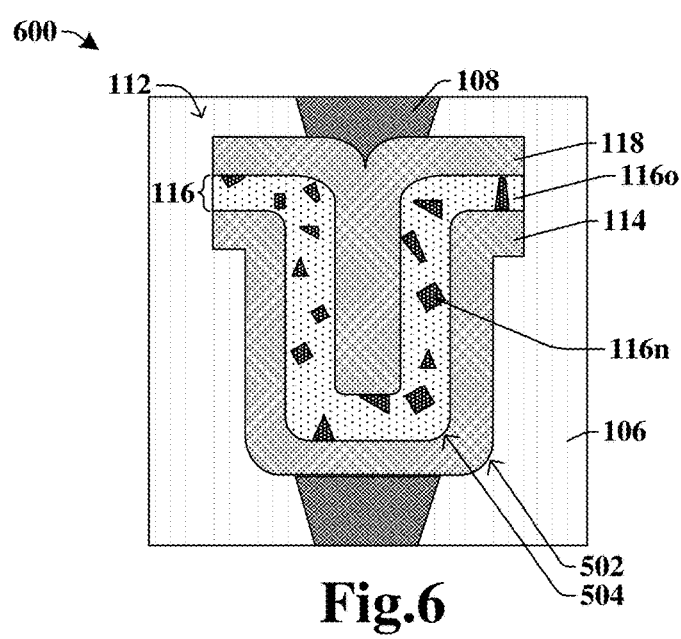

FIG. 6 illustrates a cross-sectional view 600 of some embodiments of the MFM structure 112 illustrating an exemplary distribution of phases of the crystal structure of the ferroelectric layer 116.

For example, in some embodiments, the crystal structure of the ferroelectric layer 116 comprises orthorhombic phase regions 116o and non-orthorhombic phase regions 116n. Thus, as the length of the ferroelectric layer 116 is increased, so is the amount of the orthorhombic phase regions 116o of the ferroelectric layer 116 arranged between bottom and top electrodes 114, 118 to improve the ferroelectric properties and memory window of the MFM structure 112. It will be appreciated that the distribution of the orthorhombic phase regions 116o and the non-orthorhombic phase regions 116n are only exemplary in FIG. 6 and thus, may vary amongst different MFM structures 112.

Figure 7:
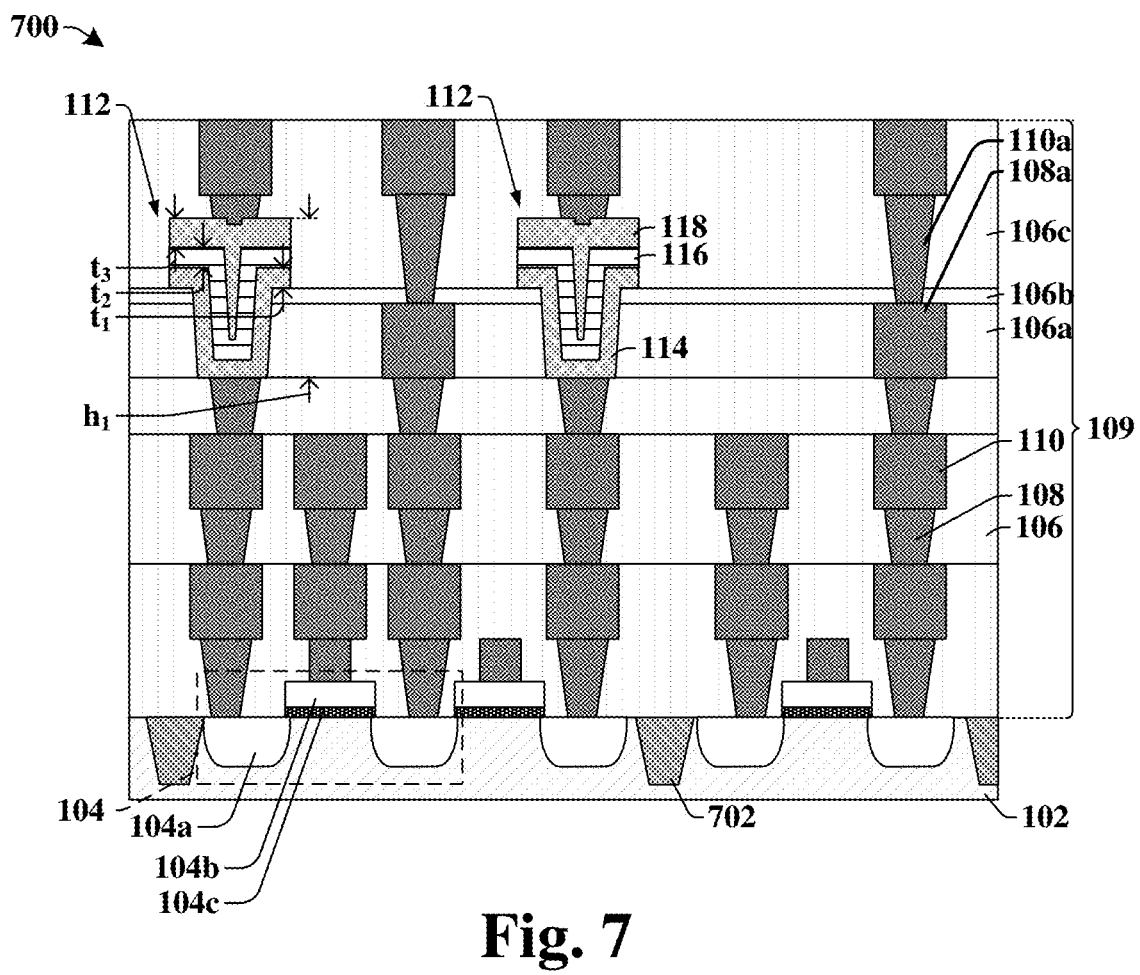
FIGS. 7 and 8 illustrate cross-sectional views of some other embodiments of an integrated chip comprising a MFM structure extending through multiple interconnect dielectric layers and comprising a ferroelectric layer extending in vertical and horizontal directions and arranged between top and bottom electrodes.

FIG. 7 illustrates a cross-sectional view 700 of some other embodiments of an integrated chip comprising an MFM structure coupled to a MOSFET.

In some embodiments, more than one MFM structure 112 may be arranged over a substrate 102 and coupled to one or more underlying semiconductor devices 104. In some embodiments, the MFM structure 112 may be coupled to the source/drain region 104a of the underlying semiconductor device 104. In some embodiments, isolation structure 702 may be arranged within the substrate 102 to separate underlying semiconductor devices 104 from one another.

In some embodiments, the MFM structure 112 has a first height hi measured in the vertical direction and equal to a value in a range of between, for example, approximately 150 nanometers to approximately 600 nanometers. In some embodiments, a first interconnect wire 110a and a first interconnect via 108a are arranged laterally beside the MFM structure 112. In some embodiments, the first interconnect wire 110a and the first interconnect via 108a also extend through the first, second, and third interconnect dielectric layers 106a, 106b, 106c. In some embodiments, the first height hi of the MFM structure 112 is greater than a height of the first interconnect wire 110a and is greater than a height of the first interconnect via 108a.

In some embodiments, the bottom electrode 114 of the MFM structure 112 has a first thickness $t_1$ measured in the vertical direction and equal to a value in a range of between, for example, approximately 5 nanometers and approximately 30 nanometers. In some embodiments, the ferroelectric layer 116 of the MFM structure 112 has a second thickness $t_2$ measured in the vertical direction and equal to a value in a range of between, for example, approximately 5 nanometers and approximately 30 nanometers. In some embodiments, the top electrode 118 of the MFM structure 112 has a third thickness $t_3$ measured in the vertical direction and equal to a value in a range of between, for example, approximately 5 nanometers and approximately 30 nanometers.

Figure 8:
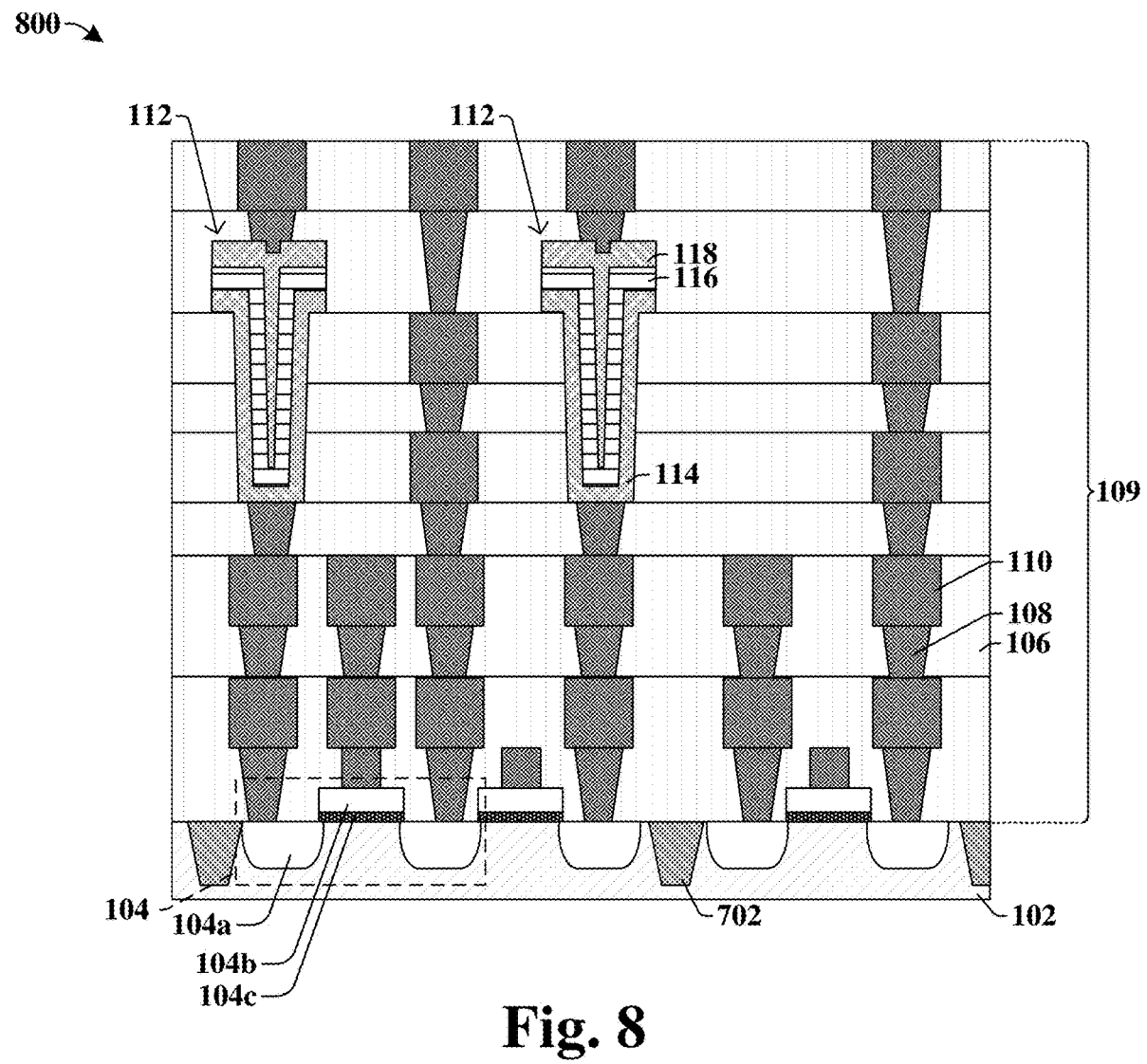

FIG. 8 illustrates a cross-sectional view 800 of yet some other embodiments of an integrated chip comprising an MFM structure.

In some other embodiments, the MFM structure 112 extends vertically through more than two of the interconnect dielectric layers 106. In some such embodiments, the length of the ferroelectric layer 116 of the MFM structure 112 is increased, thereby increasing the instance of the orthorhombic phase in the ferroelectric layer 116, improving the ferroelectric properties of the ferroelectric layer 116, and improving the memory window and reliability of the overall MFM-MOSFET device.

FIGS. 9-22 illustrate cross-sectional views 900-2200 of some embodiments of a method of forming an integrated chip comprising a MFM structure. Although FIGS. 9-22 are described in relation to a method, it will be appreciated that the structures disclosed in FIGS. 9-22 are not limited to such a method, but instead may stand alone as structures independent of the method.

Figure 9:
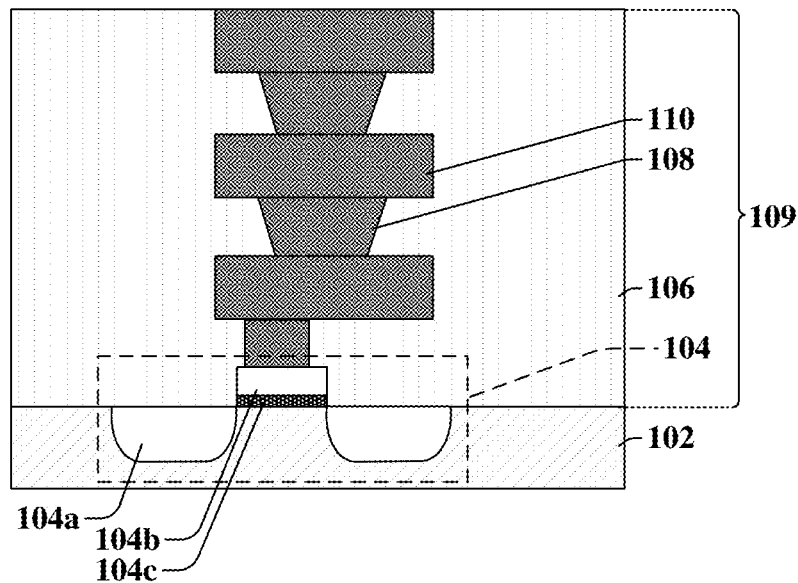
FIGS. 9-22 illustrate cross-sectional views of some embodiments of a method of forming a MFM structure within multiple interconnect dielectric layers and comprising a ferroelectric layer extending in vertical and horizontal directions to increase the length of the ferroelectric layer without sacrificing device density.

As shown in cross-sectional view 900 of FIG. 9, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. An underlying semiconductor device 104, such as a metal-oxide-semiconductor field-effect transistor (MOSFET), may be formed over the substrate 102 and may comprise source/drain regions 104a, a gate electrode 104b, and a gate dielectric layer 104c. In some embodiments, the underlying semiconductor device 104 is formed through various steps of patterning (e.g., photolithography/etching), deposition (e.g., physical vapor deposition (PVD), chemical vapor deposition (CVD), atomic layer deposition (ALD), sputtering, spin-on, etc.), removal (e.g., etching, chemical mechanical planarization (CMP), etc.), and doping processes (e.g., ion implantation, etc.).

In some embodiments, an interconnect structure 109 comprising interconnect wires 110 and interconnect vias 108 embedded within interconnect dielectric layers 106 is arranged over the substrate 102 and coupled to the underlying semiconductor device 104. In some embodiments, the interconnect vias 108 and interconnect wires 110 are directly coupled to the gate electrode 104b of the underlying semiconductor device 104. In some other embodiments, the interconnect vias 108 and interconnect wires 110 are directly coupled to one of the source/drain regions 104a of the underlying semiconductor device 104. In some embodiments, the interconnect vias 108 and interconnect wires 110 may be formed using a damascene process (e.g., a single damascene process or a dual damascene process). In some embodiments, the interconnect vias 108 and the interconnect wires 110 may comprise tungsten, copper, and/or aluminum, and/or the like. In some embodiments, the interconnect dielectric layers 106 may comprise for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, an etch stop layers (not shown) are formed between the interconnect dielectric layers 106. In some embodiments, the interconnect dielectric layers 106 are formed by way of a deposition process (e.g., PVD, CVD, ALD, etc.).

Figure 10:
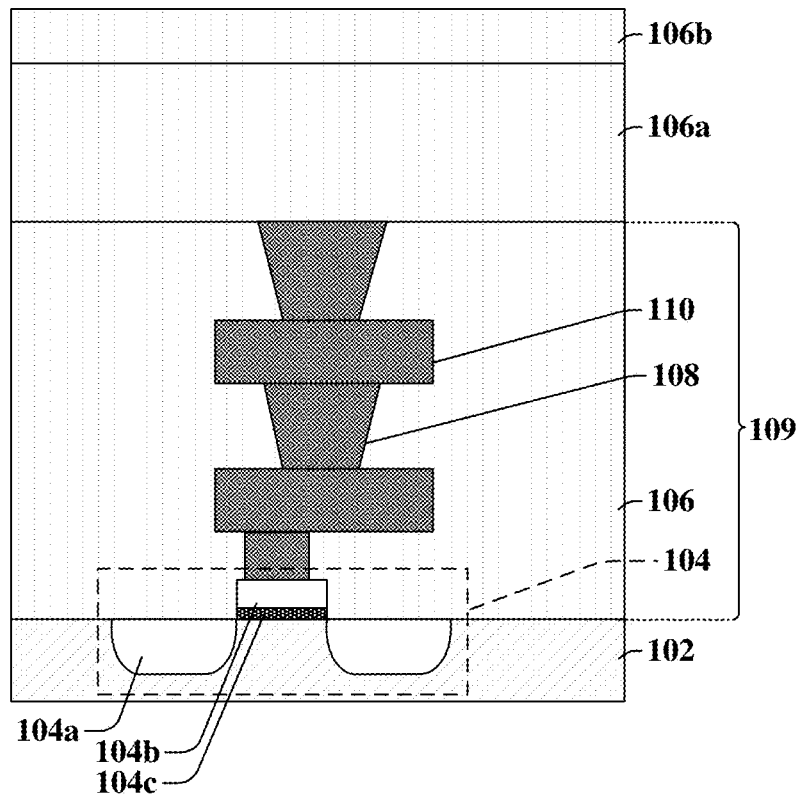

As shown in cross-sectional view 1000 of FIG. 10, in some embodiments, a second interconnect dielectric layer 106b arranged over a first interconnect dielectric layer 106a are formed over the interconnect structure 109. In some such embodiments, the first and second interconnect dielectric layers 106a, 106b comprise a same material and are formed using the same process as the other interconnect dielectric layers 106. Thus, in some embodiments, the first and second interconnect dielectric layers 106a, 106b may comprise for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first and second interconnect dielectric layers 106a, 106b are formed by way of a deposition process (e.g., PVD, CVD, ALD, etc.).

Figure 11:
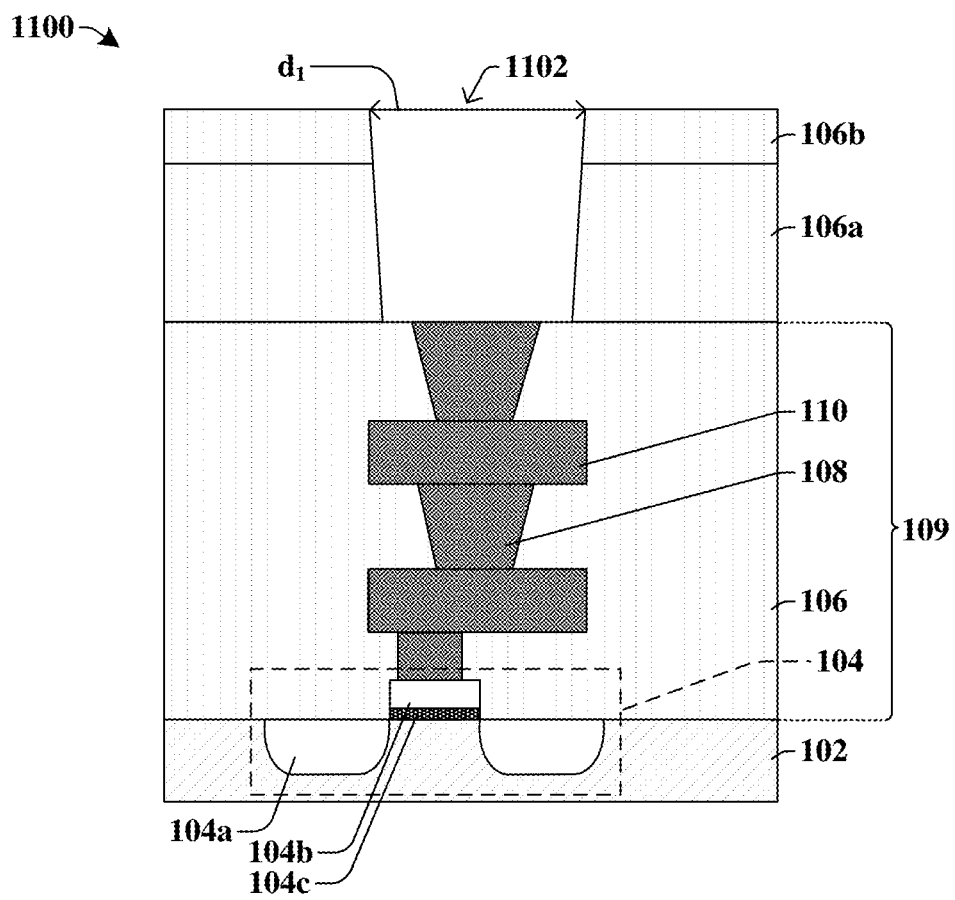

As shown in cross-sectional view 1100 of FIG. 11, in some embodiments the first and second interconnect dielectric layers 106a, 106b are patterned to form an opening 1102 within the first and second interconnect dielectric layers 106a, 106b. In some embodiments, the opening 1102 is according to an opening in a masking structure (not shown) arranged over the second interconnect dielectric layer 106b, wherein the masking structure is formed using various steps of deposition (e.g., PVD, CVD, ALD, spin-on, etc.) and patterning (e.g., photolithography/etching) processes. In some embodiments, the opening 1102 is then formed using an etching process (e.g., wet etching, dry etching) to remove portions of the first and second interconnect dielectric layers 106a, 106b uncovered by the masking structure. In some embodiments, the opening 1102 exposes an upper surface of one of the interconnect vias 108. In some embodiments, the opening 1102 has a width equal to a first distance $d_1$ in a range of between, for example, approximately 40 nanometers and approximately 250 nanometers. In some embodiments, the first distance $d_1$ is the critical dimension of the opening 1102 which may depend on processing tool limitations. In some embodiments the first distance $d_1$ of the opening 1102 is less than a depth of the opening 1102 in the vertical direction. In some other embodiments the first distance $d_1$ of the opening 1102 is greater than or equal to the depth of the opening 1102 in the vertical direction.

Figure 12:
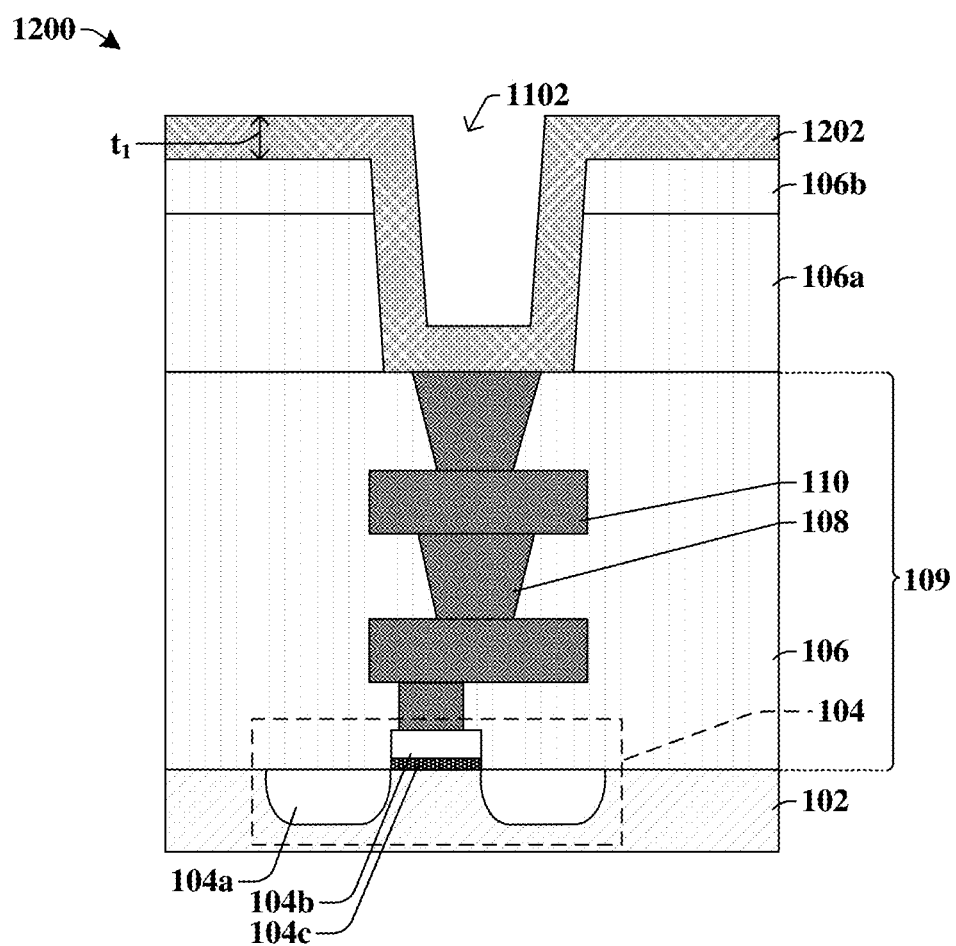

As shown in cross-sectional view 1200 of FIG. 12, in some embodiments, a first electrode layer 1202 is formed over the first and second interconnect dielectric layers 106a, 106b and along sidewalls and a lower surface of the opening 1102. In some embodiments, the first electrode layer 1202 is formed by a deposition process (e.g., PVD, CVD, ALD, sputtering, etc.) and/or plating process (e.g., electroplating, electro-less plating, etc.). In some embodiments, the first electrode layer 1202 comprises, for example, titanium nitride, tantalum nitride, tungsten, ruthenium, iridium, or the like. In some embodiments, the first electrode layer 1202 is formed to have a first thickness $t_1$ that is in a range of between, for example, approximately 5 nanometers and approximately 30 nanometers. The first thickness $t_1$ of the first electrode layer 1202 is less than one half of the first distance ($d_1$ of FIG. 11) such that the first electrode layer 1202 does not completely fill the opening 1102.

Figure 13:
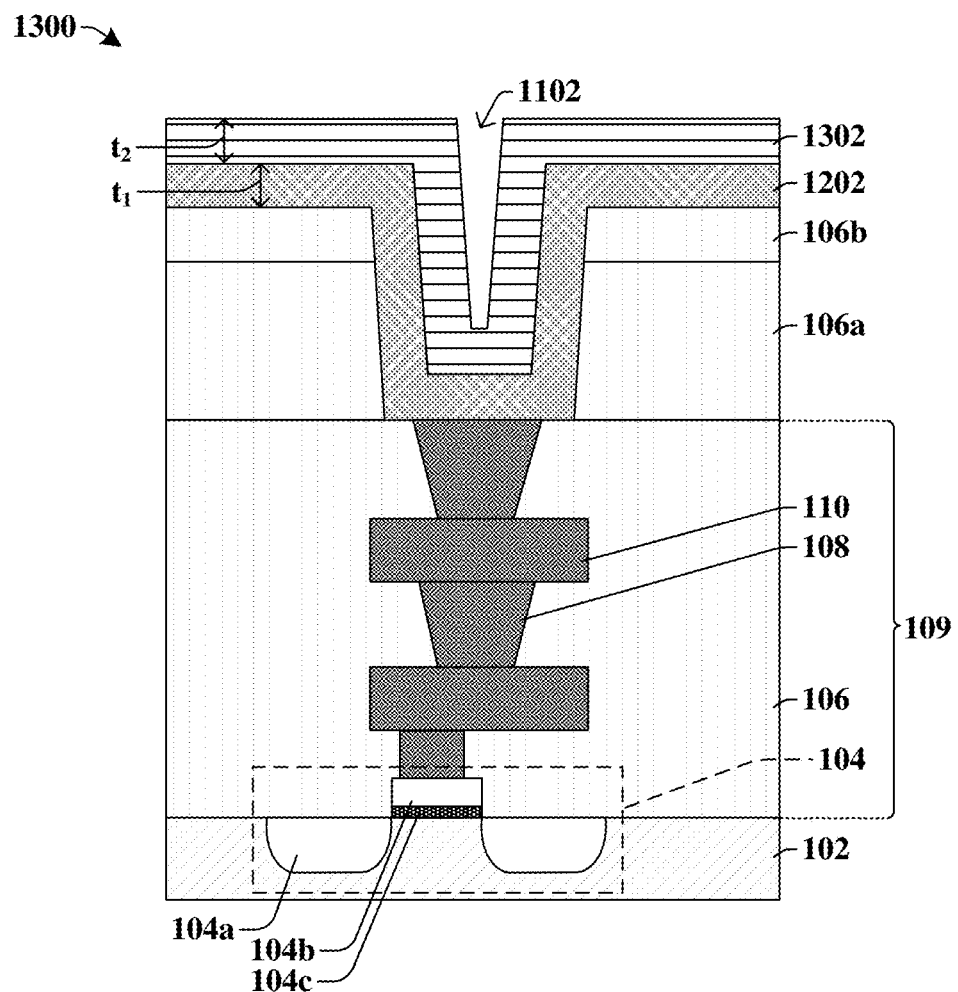

As shown in cross-sectional view 1300 of FIG. 13, in some embodiments, a ferroelectric memory layer 1302 is formed over the first electrode layer 1202. In some embodiments, the ferroelectric memory layer 1302 is formed by a deposition process (e.g., PVD, CVD, ALD, sputtering, etc.) and/or plating process (e.g., electroplating, electro-less plating, etc.). In some embodiments, the ferroelectric memory layer 1302 comprises, for example, strontium bismuth tantalite, lead zirconate titanate, hafnium zirconium oxide, doped hafnium oxide, or some other suitable ferroelectric material. In some embodiments, the ferroelectric memory layer 1302 is formed to have a second thickness $t_2$ that is in a range of between, for example, approximately 5 nanometers and approximately 30 nanometers. A sum of the first thickness $t_1$ of the first electrode layer 1202 and the second thickness $t_2$ of the ferroelectric memory layer 1302 is less than one half of the first distance ($d_1$ of FIG. 11) such that the first electrode layer 1202 and the ferroelectric memory layer do not completely fill the opening 1102.

Figure 14:
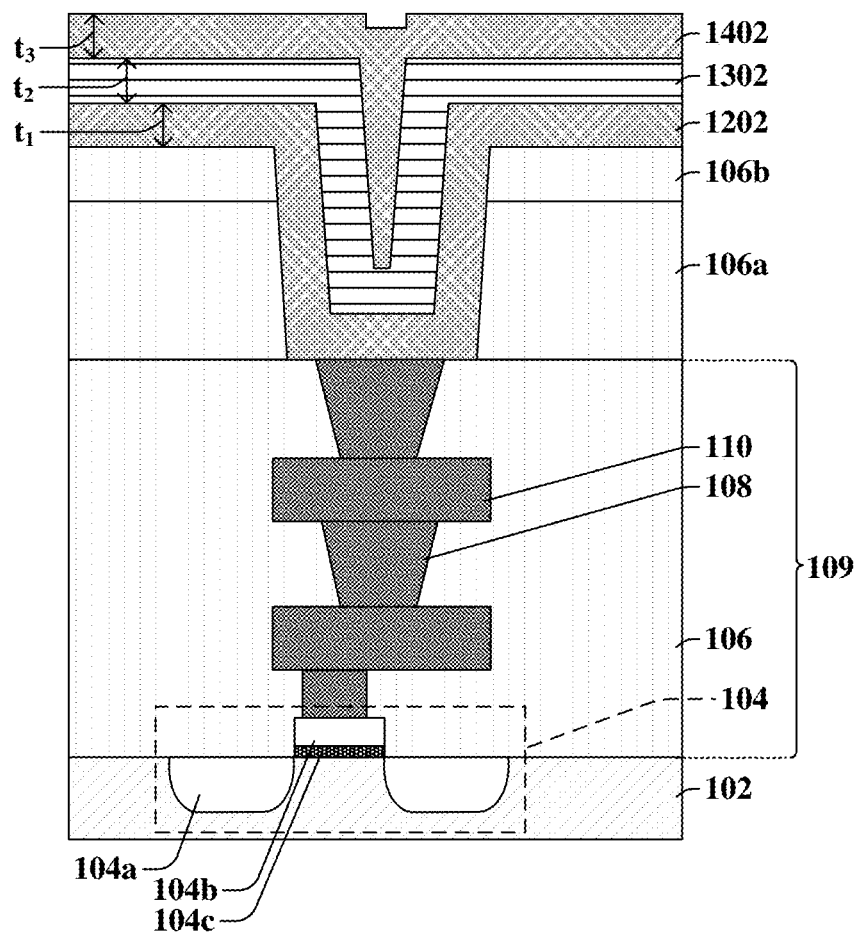

As shown in cross-sectional view 1400 of FIG. 14, in some embodiments, a second electrode layer 1402 is formed over the ferroelectric memory layer 1302 and completely fills remaining portions of the opening (1102 of FIG. 13) within the first and second interconnect dielectric layers 106a, 106b. In some embodiments, the second electrode layer 1402 is formed by a deposition process (e.g., PVD, CVD, ALD, sputtering, etc.) and/or plating process (e.g., electroplating, electro-less plating, etc.). In some embodiments, the second electrode layer 1402 comprises, for example, titanium nitride, tantalum nitride, tungsten, ruthenium, iridium, or the like. In some embodiments, the first electrode layer 1202 and the second electrode layer 1402 comprise a same material, whereas in some other embodiments, the first electrode layer 1202 and the second electrode layer 1402 comprise difference materials. In some embodiments, the second electrode layer 1402 is formed to have a third thickness $t_3$ that is in a range of between, for example, approximately 5 nanometers and approximately 30 nanometers.

Figure 15:
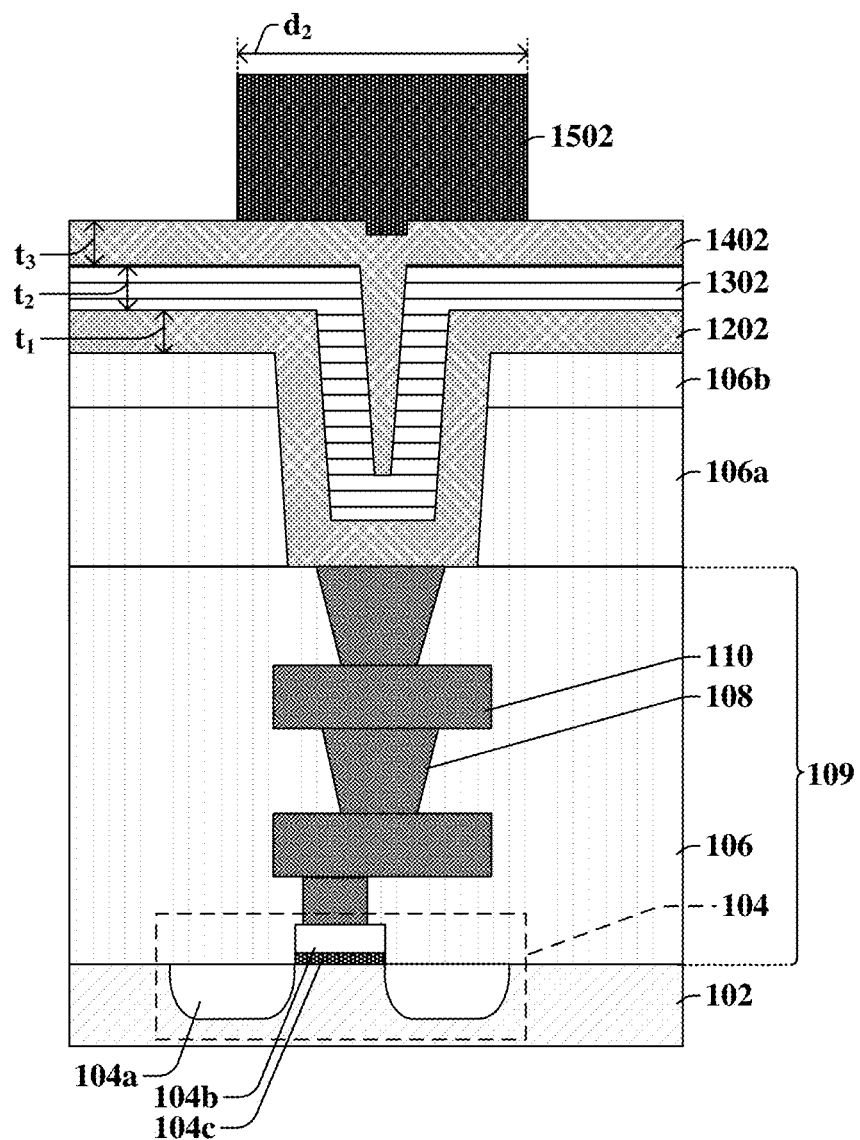

As shown in cross-sectional view 1500 of FIG. 15, in some embodiments, a first masking structure 1502 is formed over the upper one of the interconnect vias 108 and over the first electrode layer 1202, the ferroelectric memory layer 1302, and the second electrode layer 1402. In some such embodiments, the first masking structure 1502 directly overlies the opening (1102 of FIG. 11) of the first and second interconnect dielectric layers 106a, 106b. In some embodiments, the first masking structure 1502 is formed using photolithography and removal (e.g., etching) processes. In some embodiments, the first masking structure 1502 comprises a photoresist or hard mask material. In some embodiments, the first masking structure 1502 has a width equal to a second distance $d_2$. In some embodiments, the second distance $d_2$ is greater than the first distance ($d_1$ of FIG. 11) of the opening (1102 of FIG. 11) in the first and second dielectric layers 106a, 106b. In some embodiments, the second distance $d_2$ is in a range of between, for example, approximately 60 nanometers and approximately 300 nanometers.

Figure 16:
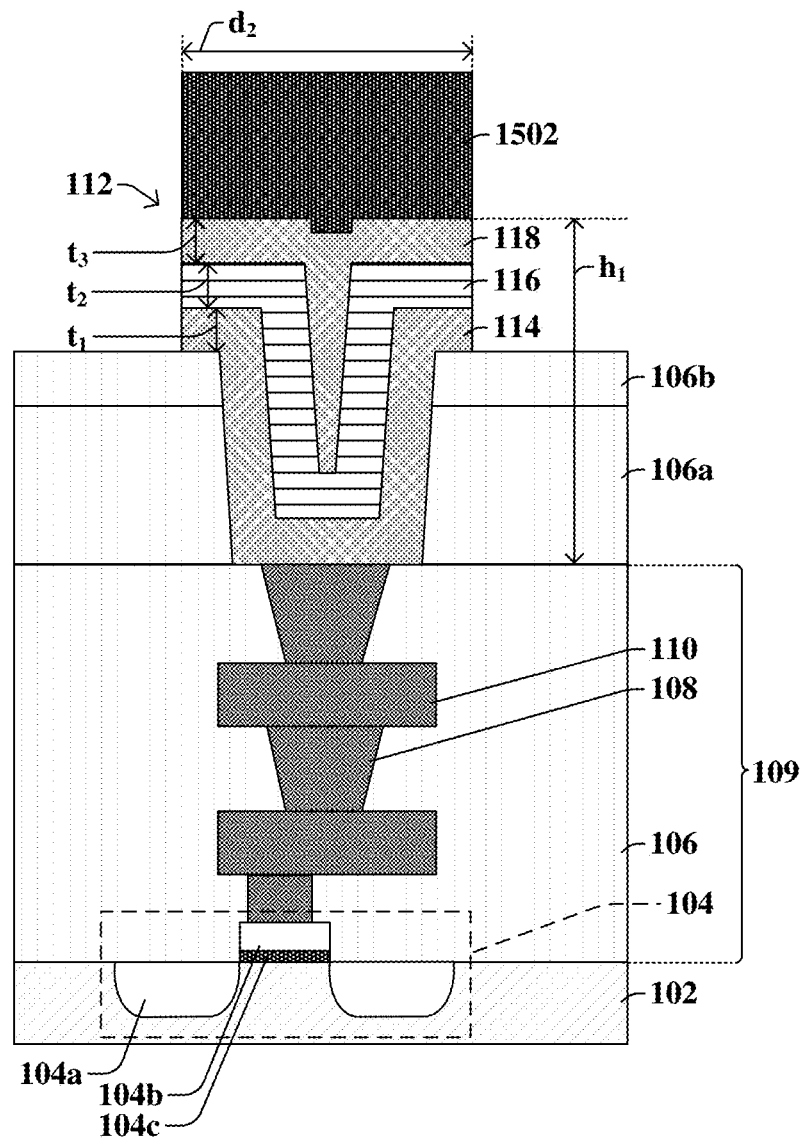

As shown in cross-sectional view 1600 of FIG. 16, in some embodiments, a removal process is performed to remove peripheral portions of the first electrode layer (1202 of FIG. 15), the ferroelectric memory layer (1302 of FIG. 15), and the second electrode layer (1402 of FIG. 15) that are uncovered by the first masking structure 1502 to form a metal-ferroelectric-metal (MFM) structure 112. The MFM structure 112 comprises a ferroelectric layer 116 arranged directly between a top electrode 118 and a bottom electrode 114. In some embodiments, the MFM structure 112 has a first height hi measured between a bottommost surface of the bottom electrode 114 and a topmost surface of the top electrode 118. In some embodiments, the first height hi is in a range of between, for example, approximately 150 nanometers and approximately 600 nanometers.

Because the ferroelectric layer 116 extends in both the horizontal and vertical directions and both over and within the first and second dielectric layers 106a, 106b, the ferroelectric layer 116 has a longer length than the first distance ($d_1$ of FIG. 11) and longer than the second distance $d_2$ without increasing the critical dimension (e.g., the first distance $d_1$ of FIG. 11) of the MFM structure 112. Therefore, when the length of the ferroelectric layer 116 is increased, the ferroelectric properties and memory window of the MFM structure 112 are improved, thereby improving the reliability of the MFM structure 112 without compromising device density over the substrate 102.

Figure 17:
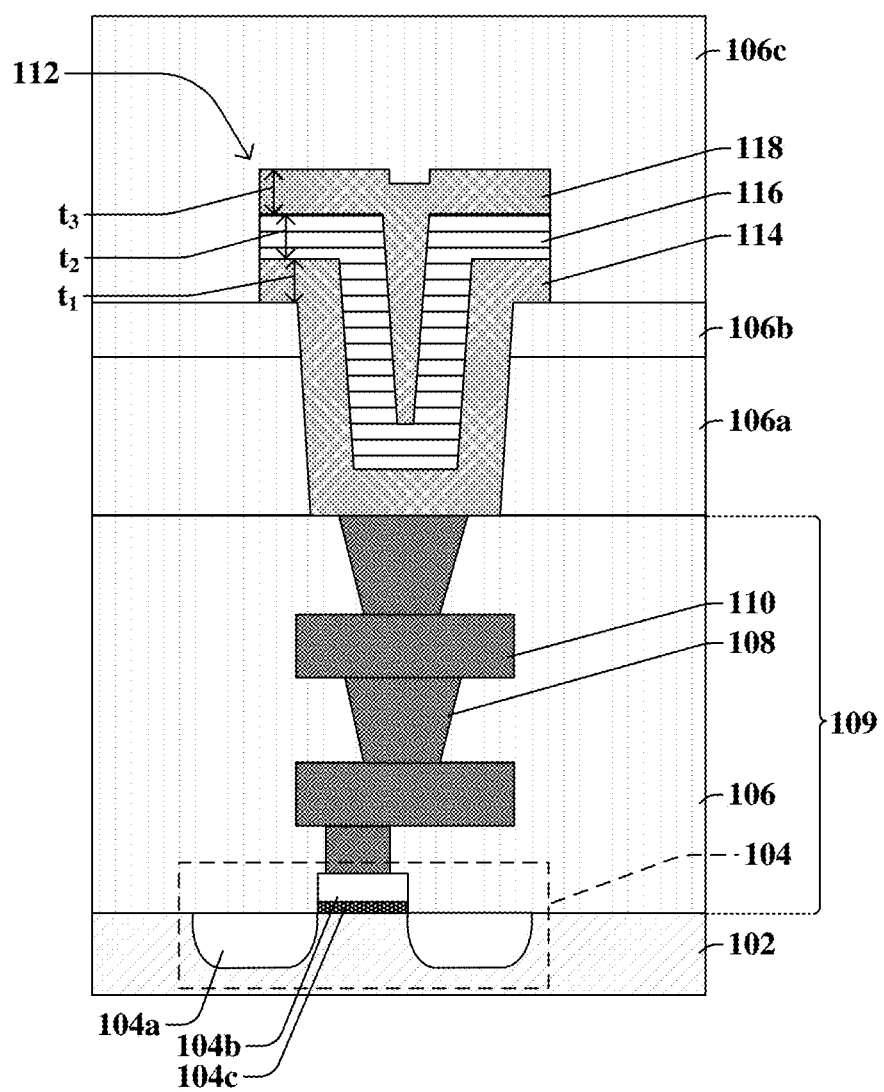

As shown in cross-sectional view 1700 of FIG. 17, in some embodiments, a third interconnect dielectric layer 106c is formed over the MFM structure 112 and over the second interconnect dielectric layer 106b. In some such embodiments, the third interconnect dielectric layer 106c comprises a same material and is formed using the same process as the other interconnect dielectric layers 106. Thus, in some embodiments, the third interconnect dielectric layer 106c may comprise for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the third interconnect dielectric layer 106c is formed by way of a deposition process (e.g., PVD, CVD, ALD, etc.).

Figure 18:
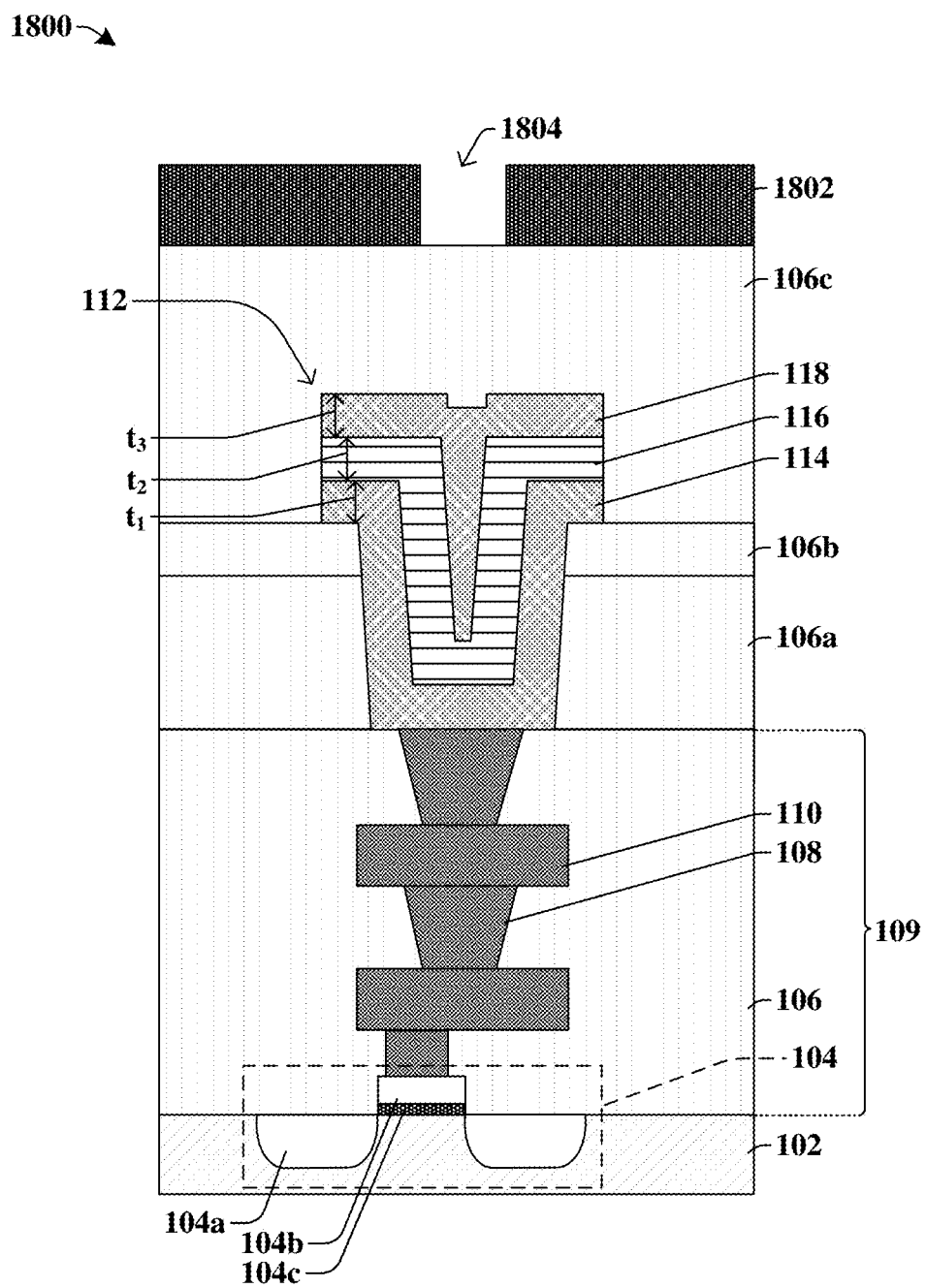

As shown in cross-sectional view 1800 of FIG. 18, in some embodiments, a second masking structure 1802 is formed over the third interconnect dielectric layer 106c. In some embodiments, the second masking structure 1802 comprises a second opening 1804 that directly overlies the opening (1102 of FIG. 11) of the first and second interconnect dielectric layers 106a, 106b. In some embodiments, the second masking structure 1802 is formed using photolithography and removal (e.g., etching) processes. In some embodiments, the second masking structure 1802 comprises a photoresist or hard mask material. In some embodiments, a width of the second opening 1804 of the second masking structure 1802 is less than the second distance ($d_2$ of FIG. 15) of the first masking structure (1502 of FIG. 15).

Figure 19:
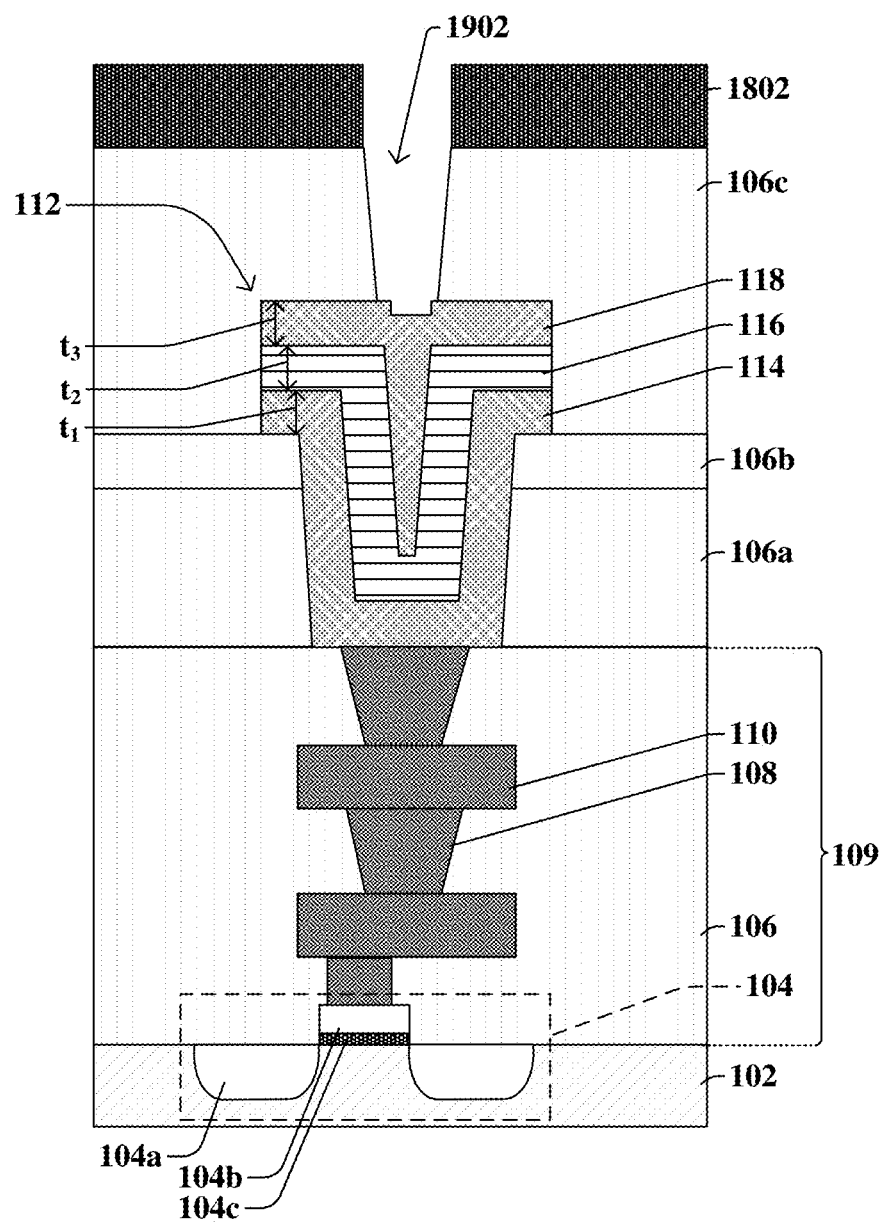

As shown in cross-sectional view 1900 of FIG. 19, in some embodiments, a removal process is performed to remove portions of the third interconnect dielectric layer 106c arranged below the opening (1804 of FIG. 18) of the second masking structure 1802, thereby forming a third opening 1902 within the third interconnect dielectric layer 106c. In some embodiments, the removal process of FIG. 19 comprises a wet or dry etching process. In some embodiments, the third opening 1902 within the third interconnect dielectric layer 106c exposes an upper surface of the top electrode 118 of the MFM structure 112.

Figure 20:
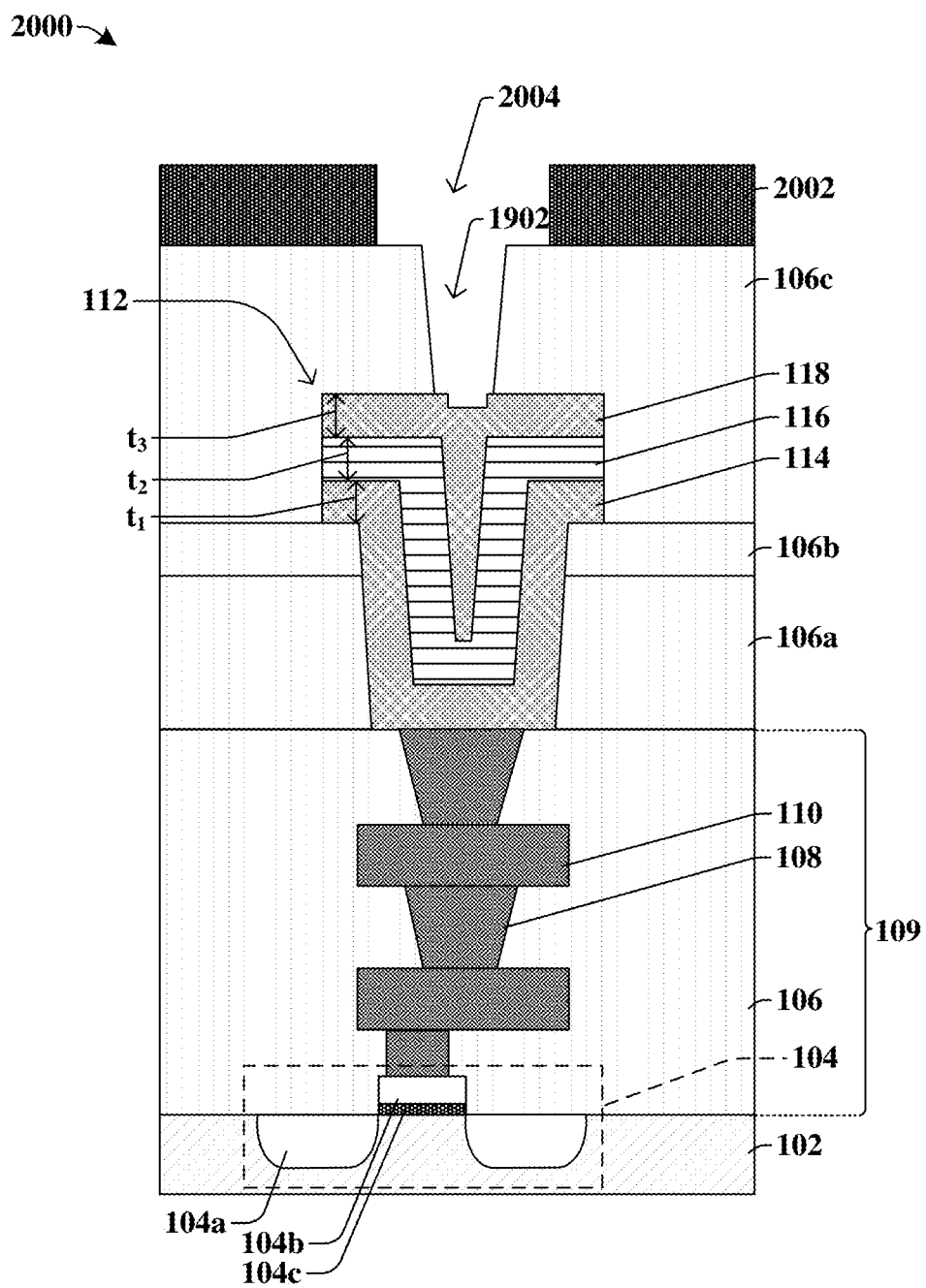

As shown in cross-sectional view 2000 of FIG. 20, in some embodiments, a third masking structure 2002 comprising a fourth opening 2004 is formed over the third interconnect dielectric layer 106c. In some embodiments, the fourth opening 2004 of the third masking structure 2002 is arranged directly over and wider than the third opening 1902 of the third interconnect dielectric layer 106c. In some embodiments, the third masking structure 2002 is formed using photolithography and removal (e.g., etching) processes. In some embodiments, the third masking structure 2002 comprises a photoresist or hard mask material. In some embodiments, the third masking structure 2002 is formed after removing the second masking structure (1802 of FIG. 19), whereas in some other embodiments, the third masking structure 2002 is the second masking structure (1802 of FIG. 19), wherein the second masking structure (1802 of FIG. 19) is patterned to have a wider opening to form the third masking structure 2002 having the fourth opening 2004.

Figure 21:
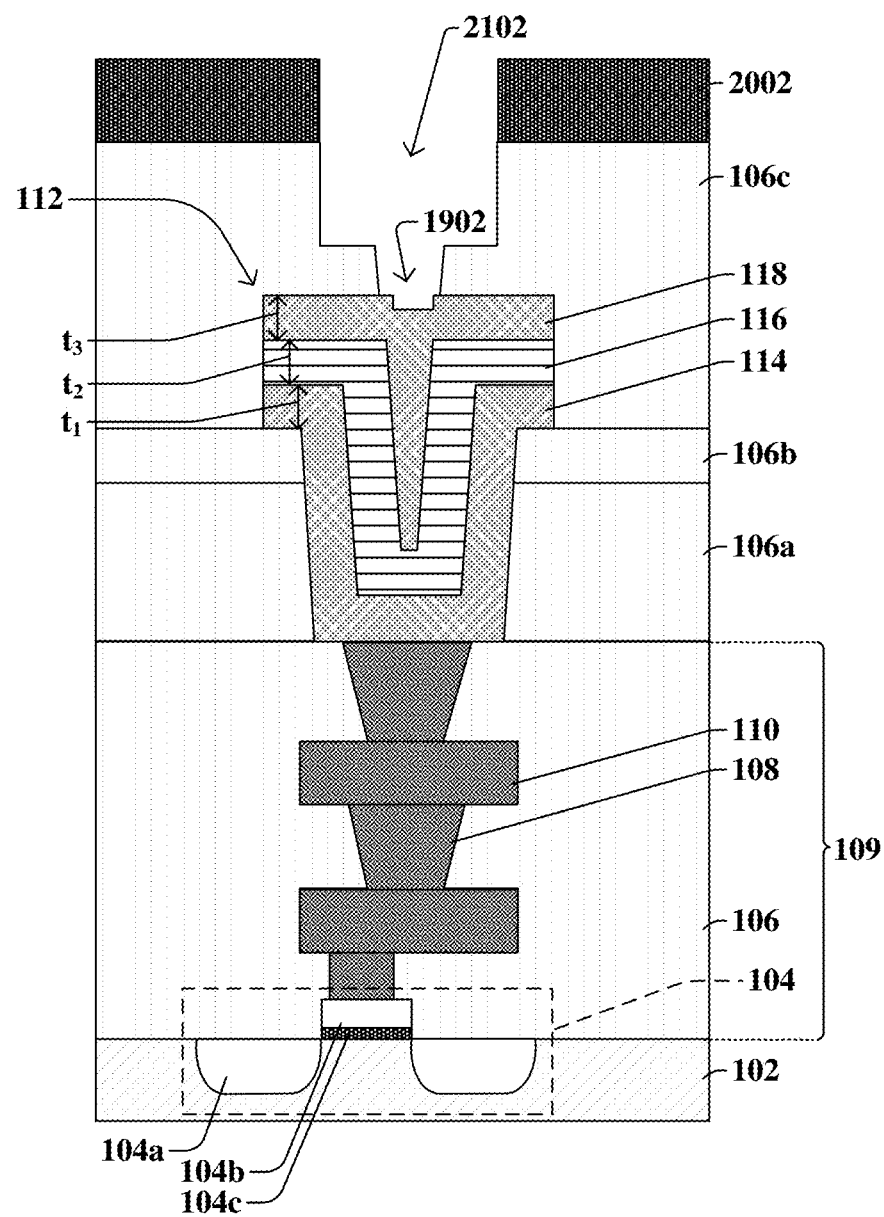

As shown in cross-sectional view 2100 of FIG. 21, in some embodiments, a removal process is performed to remove an upper portion of the third interconnect dielectric layer 106c according to the third masking structure 2002. Thus, in some embodiments, the removal process of FIG. 21 widens an upper portion of the third opening 1902 to form a fifth opening 2102 within the third interconnect dielectric layer 106c that is arranged over and wider than the remaining portion of the third opening 1902 in the third interconnect dielectric layer 106c.

Figure 22:
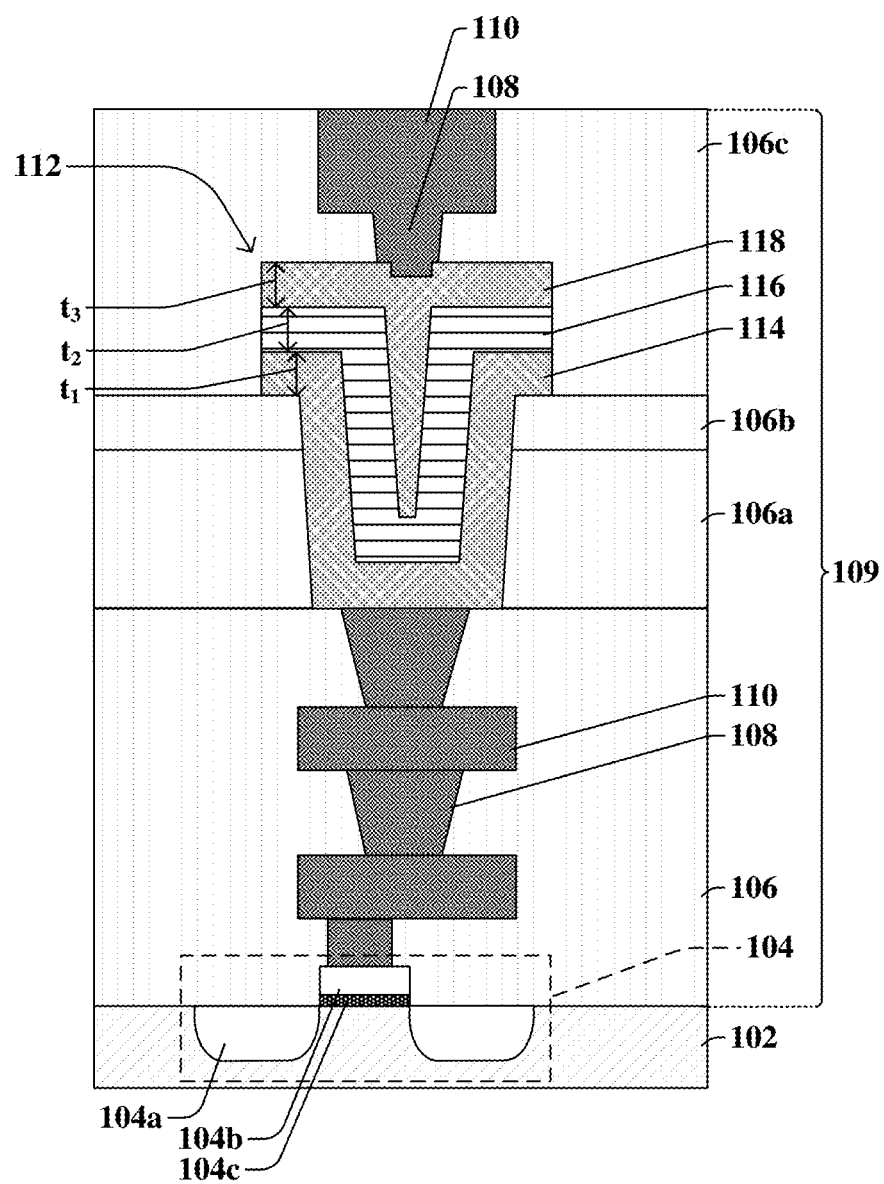

As shown in cross-sectional view 2200 of FIG. 22, in some embodiments, a conductive material is deposited within the third and fifth openings (1902, 2102 of FIG. 21) of the third interconnect dielectric layer 106c to form an interconnect via 108 and an interconnect wire 110 arranged over and coupled to the top electrode 118 of the MFM structure 112. In some embodiments, the conductive material is formed using a deposition process (e.g., PVD, CVD, ALD, sputtering, etc.). In some embodiments, the conductive material of the interconnect via 108 and the interconnect wire 110 may comprise tungsten, copper, and/or aluminum, and/or the like. In some embodiments, a removal process, such as chemical mechanical planarization, is performed to remove portions of the conductive material arranged over the third interconnect dielectric layer 106c. Thus, in some embodiments, the interconnect structure 109 further includes the interconnect dielectric layers (106a, 106b, 106c) and interconnect wires 110 and vias 108 arranged over and around the MFM structure 112. During a memory operation, a voltage bias is applied to the MFM structure 112 through the interconnect wires 110 and interconnect vias 108 such that a data value (e.g., a logical '0' or a logical '1') may be read from or written to the ferroelectric layer 116. Because the ferroelectric layer 116 has an increased length by extending in horizontal and vertical directions, the memory window that is the difference between the resistance values of the data values is increased, thereby improving the reliability of the overall MFM-MOSFET device.

Figure 23:
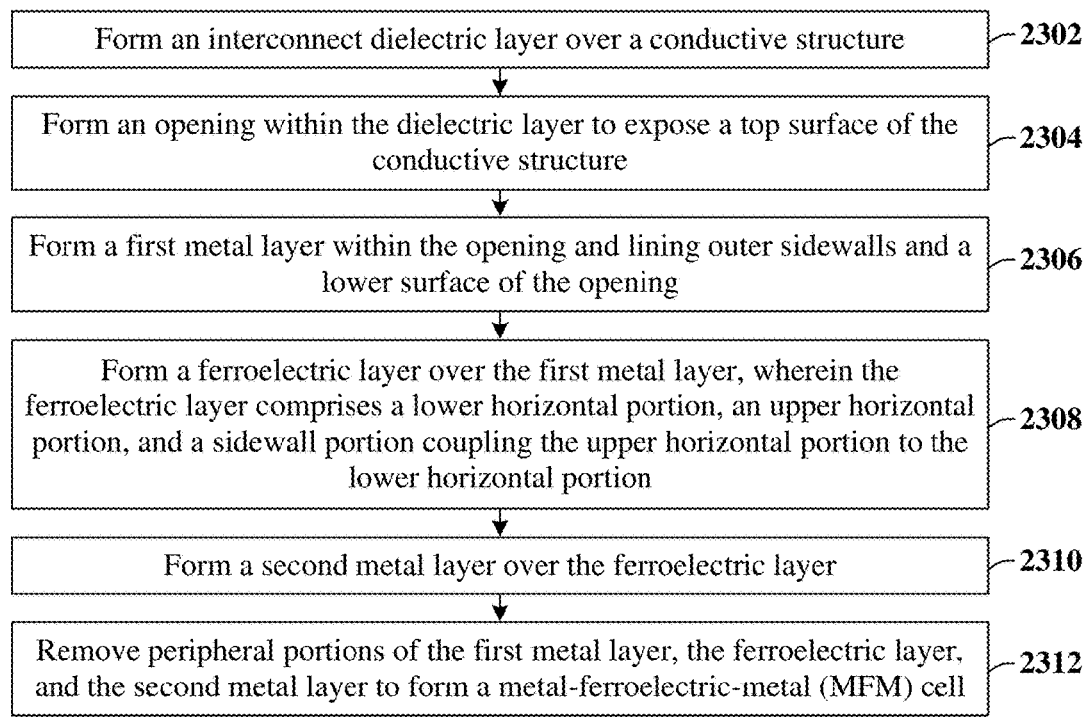
FIG. 23 illustrates a flow diagram of some embodiments of a method corresponding to the method illustrated in FIGS. 9-22.

FIG. 23 illustrates a flow diagram of some embodiments of a method 2300 corresponding to the method illustrated in FIGS. 9-22.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, an interconnect dielectric layer is formed over a conductive structure. FIG. 10 illustrates cross-sectional view 1000 that may correspond to act 2302.

At act 2304, an opening is formed within the dielectric layer to expose a top surface of the conductive structure. FIG. 11 illustrates a cross-sectional view 1100 of some embodiments that may correspond to act 2304.

At act 2306, a first metal layer is formed within the opening and lining outer sidewalls and a lower surface of the opening. FIG. 12 illustrates a cross-sectional view 1200 of some embodiments that may correspond to act 2306.

At act 2308, a ferroelectric layer is formed over the first metal layer, wherein the ferroelectric layer comprises a lower horizontal portion, an upper horizontal portion, and a sidewall portion coupling the upper horizontal portion to the lower horizontal portion. FIG. 13 illustrates a cross-sectional view 1300 of some embodiments that may correspond to act 2308.

At act 2310, a second metal layer is formed over the ferroelectric layer. FIG. 14 illustrates a cross-sectional view 1400 of some embodiments that may correspond to act 2310.

At act 2312, peripheral portions of the first metal layer, the ferroelectric layer, and the second metal layer are removed to form a metal-ferroelectric-metal (MFM) cell. FIG. 16 illustrates a cross-sectional view 1600 of some embodiments that may correspond to act 2312.

Therefore, the present disclosure relates to forming a MFM structure extending through multiple interconnect dielectric layers and comprising a ferroelectric layer having an upper horizontal portion and a lower horizontal portion coupled to one another by a sidewall portion such that the length of the ferroelectric layer is increased without increasing the MFM structure in the horizontal direction.

Accordingly, in some embodiments, the present disclosure relates to an integrated chip, comprising: one or more interconnect dielectric layers over a substrate; a bottom electrode disposed over a conductive structure and extending through the one or more interconnect dielectric layers; a top electrode disposed over the bottom electrode; and a ferroelectric layer disposed between and contacting the bottom electrode and the top electrode, wherein the ferroelectric layer comprises a first lower horizontal portion, a first upper horizontal portion arranged above the first lower horizontal portion, and a first sidewall portion and coupling the first lower horizontal portion to the first upper horizontal portion.

In other embodiments, the present disclosure relates to an integrated chip comprising: an interconnect structure arranged over a substrate and comprising interconnect conductive structures arranged within interconnect dielectric layers; and a metal-ferroelectric-metal (MFM) structure arranged within the interconnect structure and comprising: a bottom electrode layer extending through at least one of the interconnect dielectric layers to contact a first one of the interconnect conductive structures, a top electrode layer arranged over the bottom electrode layer and extending through the at least one of the interconnect dielectric layers, wherein a second one of the interconnect conductive structures is arranged over and coupled to an upper surface of the top electrode layer, and a ferroelectric layer arranged between the bottom electrode layer and the top electrode layer, wherein a first portion of the ferroelectric layer is arranged directly between the bottom and top electrodes in a horizontal direction, wherein a second portion of the ferroelectric layer is arranged directly between the bottom and top electrodes in a vertical direction, and wherein the second portion of the ferroelectric layer is arranged above the at least one of the interconnect dielectric layers.

In yet other embodiments, the present disclosure relates to a method of forming an integrated chip, comprising: forming an interconnect dielectric layer over a conductive structure; forming an opening within the interconnect dielectric layer to expose a top surface of the conductive structure; forming a first metal layer within the opening and lining outer sidewalls and a lower surface of the opening; forming a ferroelectric layer over the first metal layer, wherein the ferroelectric layer comprises a first lower horizontal portion, a first upper horizontal portion, and a first sidewall portion coupling the first lower horizontal portion to the first upper horizontal portion; forming a second metal layer over the ferroelectric layer, wherein the second metal layer fills remaining portions of the opening; and removing peripheral portions of the first metal layer, the ferroelectric layer, and the second metal layer to form a metal-ferroelectric-metal (MFM) structure comprising the ferroelectric layer arranged between a bottom electrode and a top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming an interconnect dielectric layer over a conductive structure;
   forming an opening within the interconnect dielectric layer to expose a top surface of the conductive structure;
   forming a first metal layer within the opening and lining outer sidewalls and a lower surface of the opening;
   forming a ferroelectric layer over the first metal layer, wherein the ferroelectric layer comprises a first lower horizontal portion, a first upper horizontal portion, and a first sidewall portion coupling the first lower horizontal portion to the first upper horizontal portion;
   forming a second metal layer over the ferroelectric layer;
   removing peripheral portions of the first metal layer, the ferroelectric layer, and the second metal layer to form a metal-ferroelectric-metal (MFM) structure comprising the ferroelectric layer arranged between a bottom electrode and a top electrode, the ferroelectric layer having an orthorhombic phase and a non-orthorhombic phase; and
   forming a second interconnect within the interconnect dielectric layer, the second interconnect having a different height than the MFM structure, wherein an imaginary horizontal line that is parallel to a top surface of the interconnect dielectric layer extends through sidewalls of both the second interconnect and the MFM structure.

2. The method of claim 1, further comprising:
   forming a via structure over and coupled to the MFM structure, wherein the second metal layer has one or more surfaces forming a divot that is directly over the opening and that is recessed below a top of the second metal layer, the via structure extending from within the divot to directly over the top of the second metal layer.

3. The method of claim 1, wherein a height of the opening is larger than a width of the opening.

4. The method of claim 1, further comprising:
   forming an additional interconnect dielectric layer over the second interconnect and the interconnect dielectric layer after forming the second interconnect, wherein the opening also extends through the additional interconnect dielectric layer.

5. The method of claim 1, further comprising:
   wherein the MFM structure continuously extends from below a bottom of the second interconnect to above the bottom of the second interconnect.

6. The method of claim 1,
   wherein the MFM structure continuously extends from a bottom of the second interconnect to above a top of the second interconnect.

7. The method of claim 1, wherein the bottom electrode extends from directly between sidewalls of the interconnect dielectric layer to above the top surface of the interconnect dielectric layer.

8. A method of forming an integrated chip, comprising:
   forming a first interconnect within a first dielectric layer over a substrate;
   forming a second dielectric layer over an upper surface of the first dielectric layer after forming the first interconnect;
   removing parts of both the first dielectric layer and the second dielectric layer after forming the first interconnect to form an opening extending through both the first dielectric layer and the second dielectric layer, wherein the first dielectric layer laterally extends from a first sidewall of the first dielectric layer facing the opening to a second sidewall of the first dielectric layer facing the first interconnect, the first sidewall and the second sidewall facing opposite directions;
   forming a lower electrode layer within the opening and over the second dielectric layer;
   forming a ferroelectric layer over the lower electrode layer and within the opening;
   forming an upper electrode layer over the ferroelectric layer and within the opening; and
   patterning the lower electrode layer, the ferroelectric layer, and the upper electrode layer to form a metal-ferroelectric-metal (MFM) structure extending from a bottom of the first dielectric layer to over a top of the second dielectric layer.

9. The method of claim 8, wherein the first dielectric layer and the second dielectric layer comprise low-k dielectric materials.

10. The method of claim 8, further comprising:
    forming a second interconnect within the second dielectric layer, the second interconnect being arranged over an upper surface of the first interconnect.

11. The method of claim 8, further comprising:
    forming a third dielectric layer over the second dielectric layer, wherein the third dielectric layer laterally surrounds the MFM structure.

12. The method of claim 8, wherein the lower electrode layer vertically extends from a bottom of the first interconnect to over a top of the first interconnect.

13. The method of claim 8, wherein the lower electrode layer has a greater maximum height than the first interconnect.

14. The method of claim 8, wherein the ferroelectric layer comprises a first lower horizontal portion, a first upper horizontal portion arranged above the first lower horizontal portion, and a first sidewall portion that couples the first lower horizontal portion to the first upper horizontal portion.

15. A method of forming an integrated chip, comprising:
- forming a first interconnect within a first dielectric layer over a substrate;
- forming a second dielectric layer over the first dielectric layer;
- forming a second interconnect within the second dielectric layer;
- forming a third dielectric layer over the second dielectric layer;
- etching the second dielectric layer and the third dielectric layer to form an opening exposing the first interconnect;
- forming a lower electrode layer within the opening and over the third dielectric layer, wherein the lower electrode layer vertically extends from a bottom of the second interconnect to over a top of the second interconnect;
- forming a ferroelectric layer over the lower electrode layer and within the opening, wherein the ferroelectric layer has an upper surface below a top of the second dielectric layer;
- forming upper electrode layer over the ferroelectric layer and within the opening; and
- patterning the lower electrode layer, the ferroelectric layer, and the upper electrode layer to form a metal-ferroelectric-metal (MFM) structure.

16. The method of claim 15, wherein the upper electrode layer has a lower surface that is below the top of the second dielectric layer.

17. The method of claim 15, further comprising:
- forming a third interconnect within the third dielectric layer, wherein the third dielectric layer extends between a first sidewall facing the third interconnect and a second sidewall facing the MFM structure.

18. The method of claim 17, wherein the ferroelectric layer comprises orthorhombic phase regions and non-orthorhombic phase regions.

19. The method of claim 18, wherein the second interconnect comprises an interconnect wire and the third interconnect comprises an interconnect via.

20. The method of claim 19, wherein the lower electrode layer continuously extends from a bottom of the interconnect wire to above the interconnect via.

* * * * *